GENERATOR OF FREQUENCY INCREMENTS

Filed July 6, 1956 4 Sheets-Sheet 1

INVENTOR
MADISON G. NICHOLSON JR.
BY
Norman J. O'Malley
ATTORNEY

Feb. 2, 1960 M. G. NICHOLSON, JR 2,923,891

GENERATOR OF FREQUENCY INCREMENTS

Filed July 6, 1956 4 Sheets-Sheet 2

INVENTOR
MADISON G. NICHOLSON JR.
BY
Norman J. O'Malley
ATTORNEY

INVENTOR.
MADISON G. NICHOLSON JR.
BY
Norman J. O'Malley
ATTORNEY.

INVENTOR.
MADISON G. NICHOLSON JR.
BY
Norman J. O'Malley
ATTORNEY.

United States Patent Office 2,923,891
Patented Feb. 2, 1960

2,923,891

GENERATOR OF FREQUENCY INCREMENTS

Madison G. Nicholson, Jr., Snyder, N.Y., assignor, by mesne assignments, to Sylvania Electric Products Inc., Wilmington, Del., a corporation of Delaware Application July 6, 1956, Serial No. 596,350

6 Claims. (Cl. 332—16)

Figure 1:
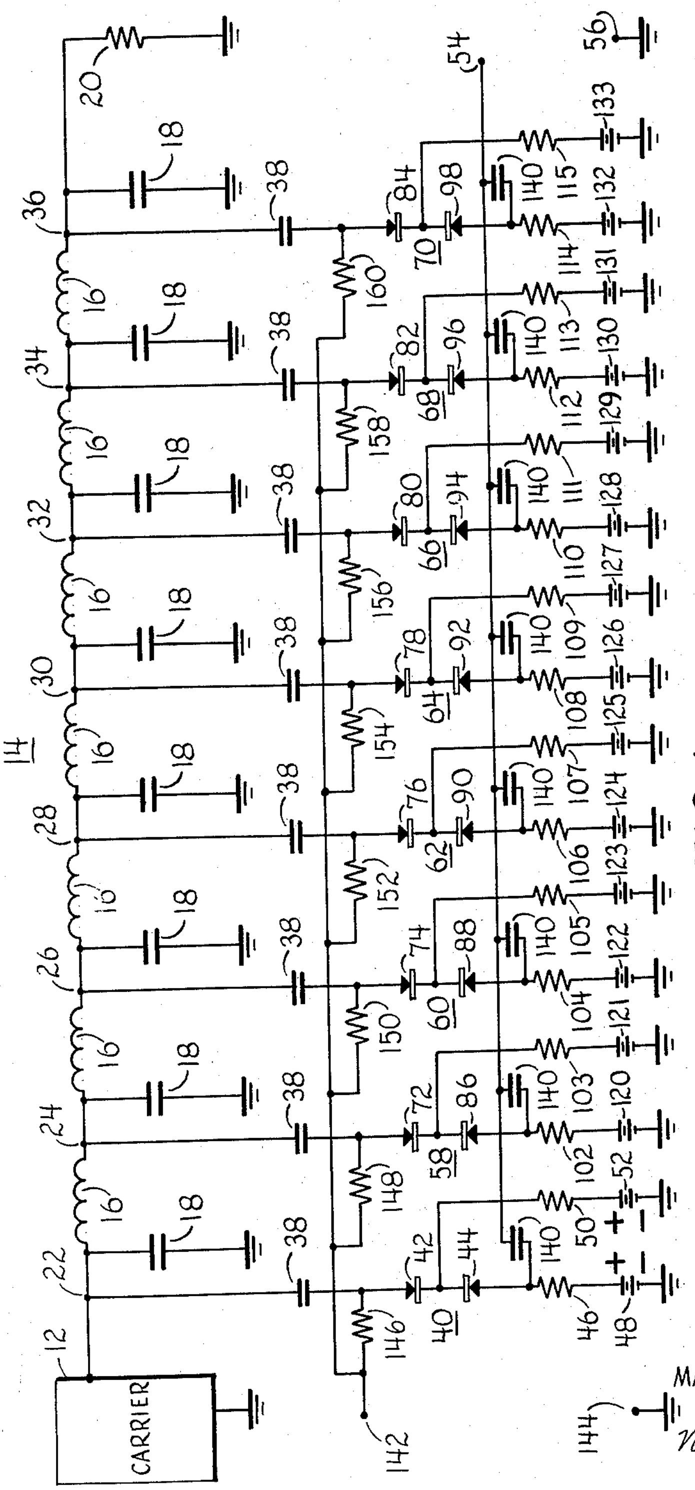

This invention relates generally to modulators and more specifically wide range phase modulators.

Most prior art phase modulators are based upon the technique of either amplitude control of one of two quadrature related sine wave voltages, or the variation of one of two quadrature related impedances. Such modulators do not seem to be suitable for producing phase shifts through a wide range, absent frequency multiplying circuitry.

Expansion of the relatively narrow dynamic range of a phase modulator through use of a frequency multiplier does allow the magnitude of the original phase modulation to be multiplied by the frequency multiplying factor and though it is possible to arrive at a relatively expanded dynamic phase shift range through use of this technique, such circuitry is inherently restricted to production of a modulated carrier wave having an average frequency the same as the frequency of the original unmodulated carrier.

Other conventional prior art modulators used in applications requiring addition or subtraction of cycles per second from a given carrier rely upon filter techniques which are only suitable for applications where realistic differences exist between the signal frequencies to be passed and the signal frequencies to be blocked by the filter. Thus, a multiude of modulation problems exist which cannot be solved readily by the use of filters because of the difficulty involved in discriminating against frequency components relatively close to the frequency components desired at the filter output. For example, addition or subtraction of a few cycles per second from a carrier signal operating in the megacycle range would require a filter capable of discriminating between megacycle per second sum and difference frequencies only differing from each other by a relatively few cycles per second. The difficulties in designing such a filter are obvious and it would be desirable to solve modulation problems of this type without stringent filter requirements.

Thus it is an object of this invention to provide a phase modulator capable of adding cycles or cycles per second to the original carrier or subtracting cycles or cycles per second from the original carrier over an extended period of time in variable or exact frequency increments.

It is a further object of this invention to provide a modulator capable of producing phase modulation in almost unlimited quantities with substantially no objectionable distortion.

It is also an object of this invention to provide a phase modulator of relatively wide range which can phase modulate either an unmodulated carrier, an amplitude modulated carrier, a frequency modulated carrier, or a phase modulated carrier with a substantially equal facility.

It is still a further object of this invention to provide a relatively wide range phase modulator responsive to either digital or analogue type of control.

Briefly, these and other objects are accomplished in one aspect of the invention, by providing a modulator which comprises means for providing one or a plurality of phase shifted carrier counterpart signals and means for selecting one or more of said phase shifted carrier counterpart signals in accordance with a variable characteristic of a modulating signal.

For a better understanding of the invention, together with other further objects, advantages and capabilities thereof, reference is made to the following description and appended claims in connection with:

Fig. 1 which shows a modulator using a delay line; and

Figure 2:
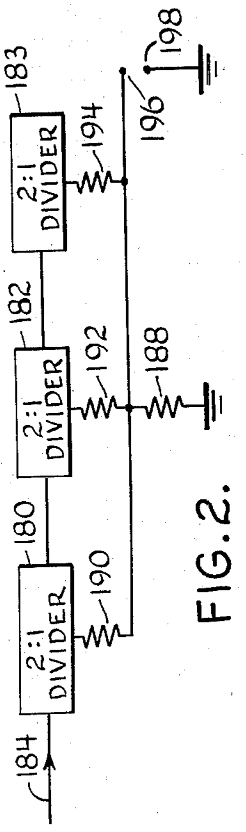
Figure 3:
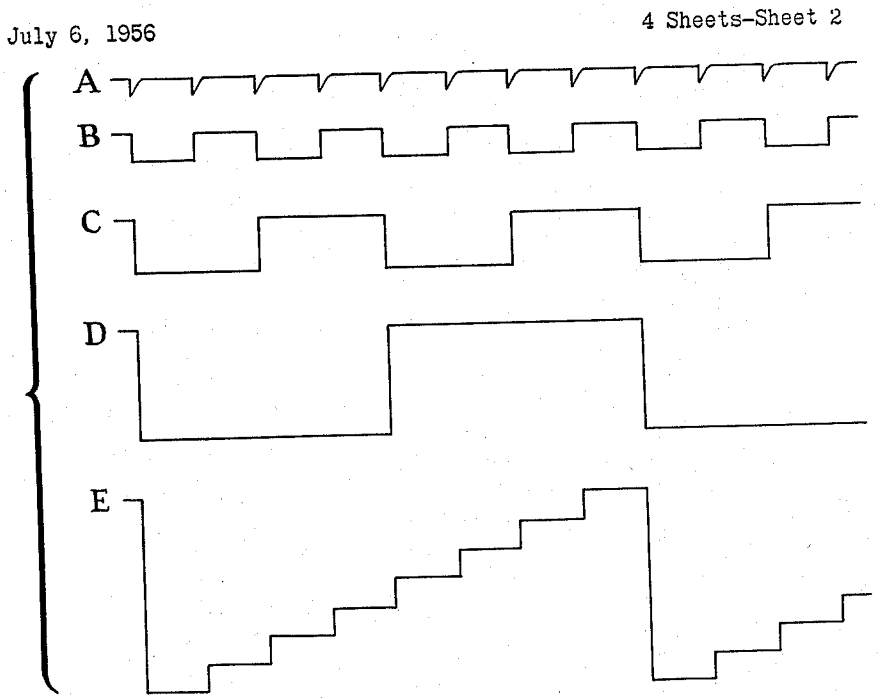
Figure 4:
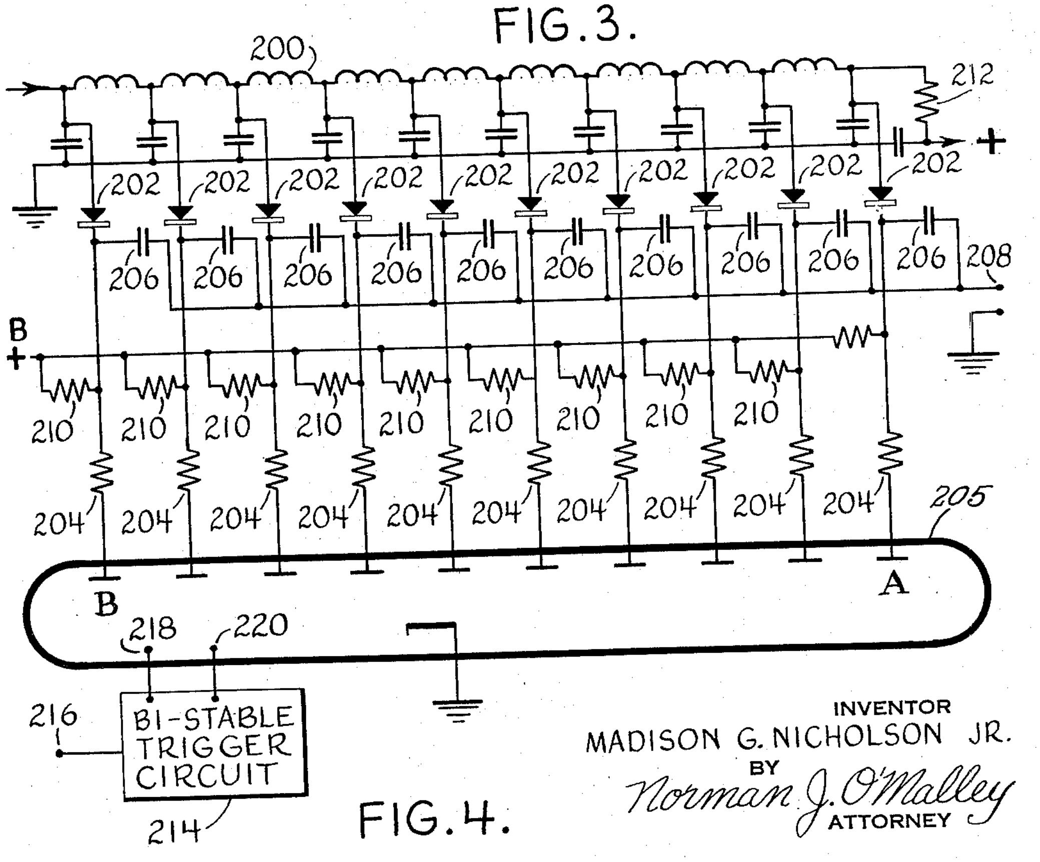
Figure 5:
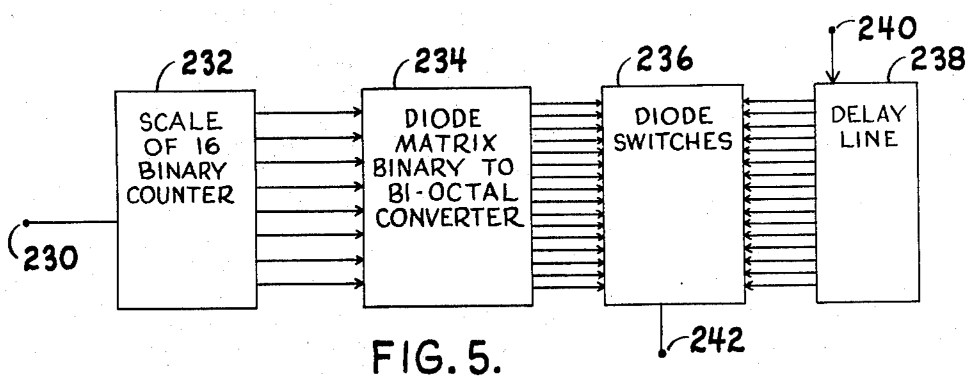
Figure 6:
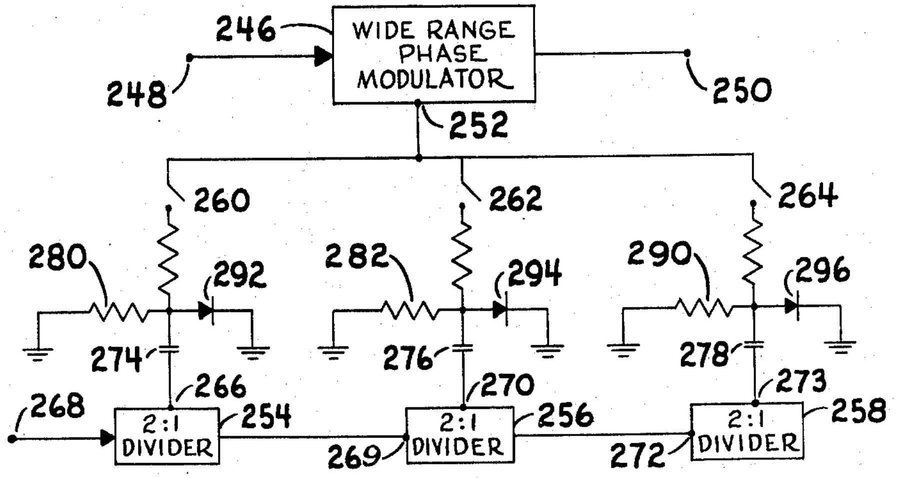
Figure 7:
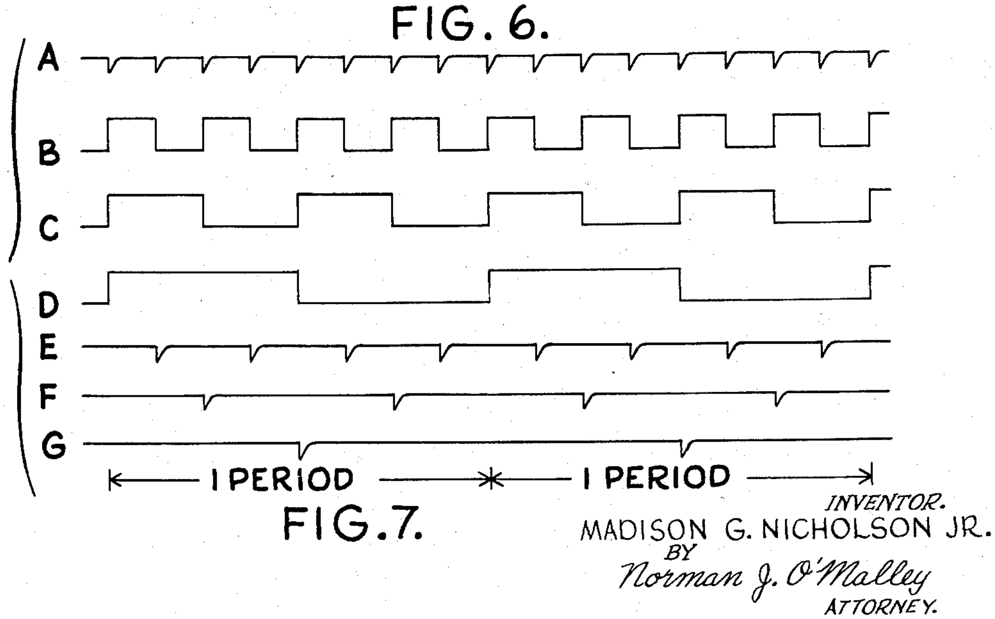
Figure 8:
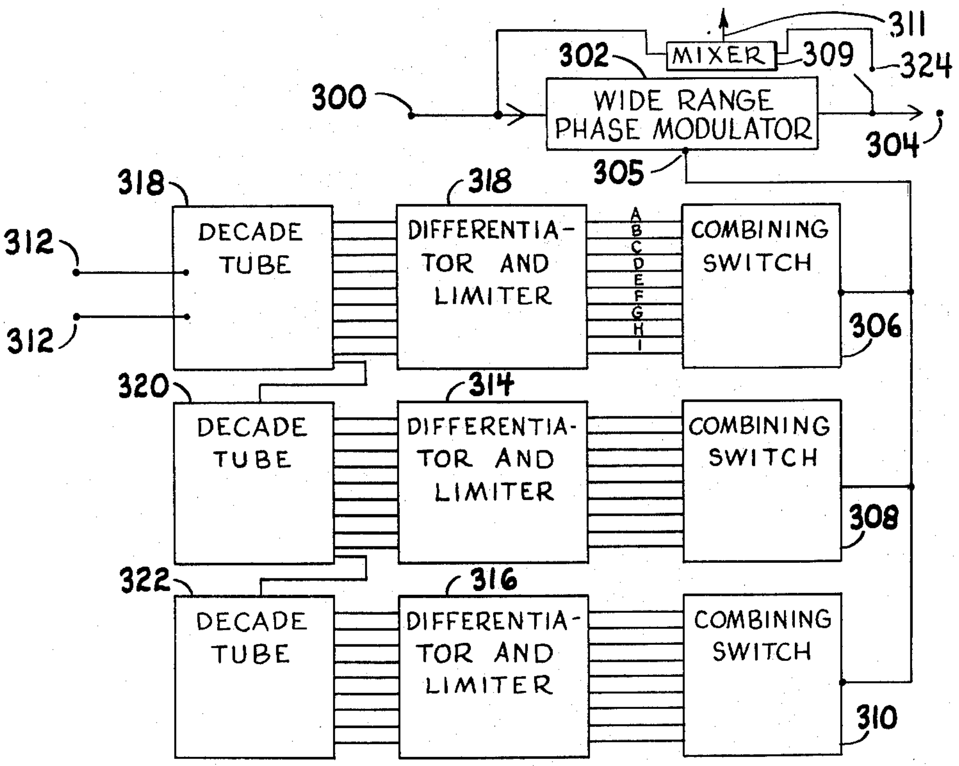
Figure 9:
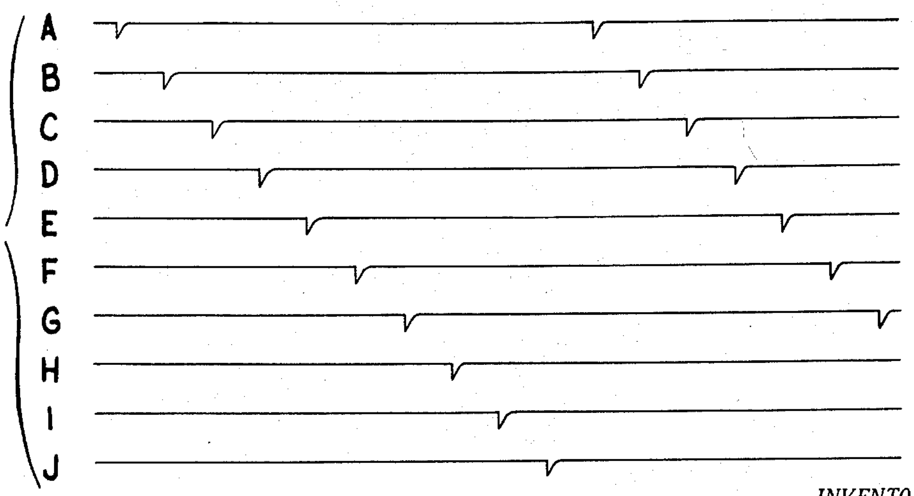

Fig. 2 which shows a circuit for producing a modulating wave for digital operation; and Fig. 3 which are curves showing pulse forms; and Fig. 4 which shows a simplified embodiment; and Fig. 5 which shows an embodiment utilizing computer techniques; and Fig. 6 which shows an embodiment suitable for producing a selectable dynamic phase shift or selectable frequency shift; and Fig. 7 which are curves showing input pulse forms; and Fig. 8 which shows a simplified embodiment; and Fig. 9 shows pulse forms used in the embodiment of Fig. 8.

In Fig. 1 there is shown a source of carrier signals 12 which may comprise, for example, either a modulated or unmodulated carrier or a series of pulses. Coupled to the output of the carrier source 12 is a delay line, shown generally at 14, which may be formed from lumped impedances comprising inductances 16 and capacitances 18. Resistance 20 is coupled across the end of the line as a terminating impedance and is usually provided with a resistance value equal to the characteristic impedance of the complete line and associated circuitry as viewed from the terminals across which the resistance is connected.

Even numbered taps from tap 22 through tap 36 are distributed symmetrically along the line and can be considered to provide a plurality of signal voltages of common fundamental frequency arrayed substantially in fixed relative time phase positions.

Each of the taps on delay line 14 are coupled through a capacitor 38 to a switching circuit. The switching or gating circuit associated with tap 22 is shown generally at 40, including a pair of unilateral conducting devices or rectifiers 42 and 44 which may be vacuum tube diodes, copper oxide or crystal type rectifiers. Other rectifying or gating devices will occur to those skilled in the art which may be advantageous in specific applications. For example, transistors may be used by slightly modifying the circuitry.

Resistance 46 is coupled between the output electrode of rectifier 44 and a source of bias voltage 48, which may be a battery or any other suitable source for providing the desired bias voltage level. Resistance 50 is coupled between the junction of rectifiers 42 and 44 and a bias source shown schematically at 52. An output may be taken from across resistor 46 and fed to output terminals 54 and 56.

As can be seen, the remainder of the switches 58, 60, 62, 64, 66, 68 and 70 are generally similar to switch 40 in that each includes a first associated rectifier 72, 74, 76, 78, 80, 82 and 84 respectively as well as a second associated rectifier 86, 88, 90, 92, 94, 96 and 98, respectively. All of the rectifiers in the switching circuits may have substantially the same characteristics though in some applications it may become desirable to use several different rectifier types because of the wide range of bias voltages which could be involved.

Each of the switches incorporates a pair of resistances 102 and 103 through 114 and 115, similar to resistances 46 and 50 shown in switch 40, except that similarly positioned resistances in the various switches, for most embodiments, will have different resistance values, Bias sources 120 through 133 may be similar to bias sources 48 and 52 except that each provides a different bias voltage level. An output from each of the switch units is taken through a coupling capacitor 140 to output terminal 54. The modulating signal which is impressed across terminals 142 and 144 is fed to each switch simultaneously through resistances 146, 148, 150, 152, 154, 156, 158 and 160.

Operation of the complete circuit shown in Fig. 1 will become apparent after considering operation of one of the switch elements, e.g., switch 40.

In general, no appreciable signal is passed from tap 22 to output terminal 54, through switch 40, until the modulating signal fed through resistance 146 reaches a predetermined level which may be selected by a choice of parameters for resistances 46, 50 and 146 and bias sources 48 and 52.

Resistances 46 and 50 have approximately equal resistance values and resistance 146 should offer half as much resistance as either resistance 46 or resistance 50, each being of a value sufficiently high so as to impose no appreciable load on the associated circuitry. If bias source 48 is then selected to be approximately 10 volts and bias source 52 is selected to be approximately 5 volts, it can be seen that rectifier 44 is biased at approximately 5 volts in the conducting direction, i.e., the anode which is coupled to resistance 46 is approximately 5 volts higher than the cathode which is coupled to resistance 50. Since resistances 46 and 50 have approximately the same value, the junction point between the cathode of rectifier 44, resistance 50 and the cathode of rectifier 42 is then approximately 7.5 volts above the voltage reference plane or ground, assuming a negligible voltage drop in rectifier 42.

Without considering variations in the amplitude of the signal fed through coupling capacitor 38, rectifier 44 is conducting when there is zero voltage between terminals 142 and 144 and rectifier 42 is nonconducting until approximately 7.5 volts is applied to its anode through resistance 146 from the modulating source. Thus when the amplitude of the modulating signal reached a level of approximately 7.5 volts, rectifier 42 starts to conduct and rectifier 44 continues to conduct passing the signal from tap 22 through switch 40 to the output terminal 54.

As the modulating signal amplitude level increases above the voltage reference plane, current flow through resistance 50 increases in a direction to increase the voltage at the cathode of rectifier 44. When the modulating signal amplitude reaches approximately 12.5 volts the resulting current flow through rectifier 42 is sufficient to cause a voltage drop of approximately 5 volts across resistance 50 of the correct polarity to add to the voltage of bias source 52 and raise the voltage at the cathode of rectifier 44 to approximately 10 volts above the voltage reference plane. As a result rectifier 44 ceases to conduct, thus blocking conduction through switch 40 to output terminal 54. The open switch modulating signal increment is thus equal to approximately 5 volts in this example.

The above explanation of circuit operation fails to take into consideration some of the factors which may become important in certain applications. For example, the dynamic impedance of rectifiers 42 and 44 as well as the amplitude range of the signal fed through coupling capacitor 38 should be considered. Due to the dynamic impedance of rectifiers 42 and 44 under signal conditions the actual switching action may not be a mere on-off function. Instead, as the switch approaches the conduction point, under control of the modulating signal, only signal peaks are passed through the switch and, as the modulating signal increases, more and more of each signal cycle is passed. The amplitude of the carrier signal being passed by the switch thus can be selected to contribute smoothness of operation and in some cases it may become desirable to select a carrier voltage amplitude larger than the open switch modulating signal voltage increment.

The remainder of the switches shown in Fig. 1 operate in a manner similar to switch 40; however, each switch is set to start conduction at a modulating signal voltage amplitude level which is different than the modulating signal amplitude level to which the other switches respond. For example, by selecting circuit parameters it is possible to cause switch 58 to conduct at 15 volts, switch 60 to conduct at 20 volts, and so on up to switch 70 which may conduct at 45 volts of modulating signal. Then as the modulating signal voltage varies between 10 volts and 45 volts, the various switches will be closed and opened in sequence and as the transition rate of the modulating signal amplitude between these two voltages is increased, the switching rate is also monotonically increased. As the transition rate of modulating signal amplitude is decreased, the switching rate is monotonically decreased.

The particular embodiment shown in Fig. 1 may be controlled by a modulating signal of selected wave form having a given pulse repetition frequency generated in a circuit similar to the one shown schematically in Fig. 2 which includes a plurality of 2 to 1 pulse type frequency divider circuits, shown in block form as units 180, 182 and 183. Divider 180 is supplied from a pulse source, not shown, through input 184. Each of the dividers 180, 182 and 183 is connected to resistance 188 through an associated resistance 190, 192 and 194, respectively. The other end of resistance 188 may be connected to a reference plane, which is shown, for example only, as ground. The output of the circuit of Fig. 2 may be taken from across terminals 196 and 198.

The relative values selected for resistances 188, 190, 192 and 194 control the contribution of each divider unit to the output signal taken from across terminals 196 and 198 and the resistance value selected for resistance 188 limits the total output voltage. For example, if resistance 192 is selected to be twice the resistance of resistance 194 and resistance 190 is selected to be four times the resistance of 194, the complete circuit of Fig. 2 may be operated to produce a modulated wave similar to that shown in Fig. 3E, in idealized form.

Referring to the curves of Fig. 3, curve A represents a series of pulses which may be fed to input 184. These negative going pips may be produced by selecting a pulse source of the desired repetition frequency, differentiating the output and feeding the resultant signal through a limiter which clips the pulses on one side of the A.C. axis.

Curve Fig. 3B shows the output contribution of divider 180, curve Fig. 3C shows the output contribution of divider 182 and curve Fig. 3D shows the output contribution of divider 183. As can be seen in the curve Fig. 3E, the output contribution from the three dividers add up to produce a step-wave form voltage which returns rapidly to a volume minimum at the end of the seventh step.

If the voltage taken from output terminals 196 and 198 in Fig. 2 is applied to the input terminals 142 and 144 of the circuit of Fig. 1 as a modulating signal and the amplitude of each incremental step in the wave form is selected to be equal to the response level of a different switch element, with the wave form voltage minimum being equal to the response level of switch 40, it can be seen that the switch elements 40, 58, 60, 62, 64, 66, 68 and 70 will be sequentially driven into a conducting and nonconducting condition.

Resulting operation is more readily understood if it be assumed that the switch bias sources are selected to bias only one switch into conduction at any given instant though this need not be the case. Thus switch 40 is driven into conduction when the modulation voltage shown in Fig. 3E is at the minimum level and is switched into a nonconducting condition just prior to the instant that switch 58 is driven into conduction by the second incremental rise in the modulating voltage. The remainder of the switches respond symmetrically with switch 70 being triggered into conduction at the peak of the wave form of Fig. 3 and triggered out of conduction when the modulating signal returns to its minimum level to again trigger switch 40 into conduction. If the switch parameters are selected to provide overlapped conduction, smoother operation for some applications results.

Overall operation of the circuits of Fig. 1 and Fig. 2 should now be readily understandable. First assume that each lumped impedance section, similar to the section including elements 16, and 18, delays the carrier approximately 45 electrical degrees. Thus tap 22 can be considered to be at zero electrical degrees, tap 24 at 45 electrical degrees, tap 26 at 90 electrical degrees and so on making tap 36 at 315 electrical degrees. Since tap 22 represents both zero and 360 electrical degrees, delay line 14 and its associated taps when fed by a signal from unit 12, provides a plurality of phase related signal voltages of common fundamental frequency arrayed in substantial phase symmetry over approximately 360 electrical degrees. Each tap on delay line 14 supplies a phase shifted counterpart of the original carrier.

When the circuit of Fig. 2 is coupled to the circuit of Fig. 1, each eight pulses fed into the input 184 will completely sweep all of the switches through one complete cycle, and if the switch sequence direction is the same as the direction of line delay, each eight pulses fed into input 184 subtracts one cycle from the carrier output realized across terminals 54 and 56. The rate of pulse input at 184 determines the cycles per second subtracted from the carrier.

To give another example, if precisely 8,000 pulses are applied to terminal 184 during each second, the output frequency at terminals 54 and 56 will be precisely 1,000 cycles per second less than the carrier frequency. In the particular embodiment shown, if divider elements 180, 182 and 183 are selected to be bistable triggered circuits, they will tend to remain in the position dictated by the last pulse impressed on the input and if the pulse train is cut off, they will maintain the output voltage dictated by the last pulse received. Therefore, when the pulse train is removed, the accumulated phase shift is maintained, i.e., the unit does not snap back to a position which makes the overall average modulated frequency equal to the unmodulated frequency. This characteristic is one of the many which distinguishes this embodiment of the invention from all known phase modulators of the prior art.

If the modulating signal is selected to have a wave form which is the reverse of the wave form in Fig. 3, i.e., it decreases in incremental steps from time zero to reach a minimum point at the end of the cycle and a maximum point at the start of the next cycle, it can be used to control the switches in the circuit of Fig. 1 so as to add cycles to the carrier frequency. By thus programming the switches to sweep in the reverse direction, triggering switch 98 immediately before switch 96 and so on back through switch 40, the output signal taken across terminals 54 and 56 continuously advances in frequency. In other words, taking the example previously considered, a signal having a pulse repetition frequency of 8,000 cycles per second would add cycles to the carrier at the rate of 1,000 cycles per second.

A simplified circuit which is also disclosed and claimed in application Serial Number 590,722, filed June 11, 1956 is shown in Fig. 4, where it can be seen that delay line 200 is generally similar to delay line 14 in Fig. 1. Each delay line tap is connected to the anode of a diode 202 having a cathode connected through a resistance 204 to a separate plate in a decade beam switching tube 205 which may be either generally similar to or the equivalent of Sylvania Tube type ST6700. An output is taken from each cathode of rectifiers 202 and fed through coupling capacitors 206 to common output terminals 208. Each of the anodes of switching tube 205 is supplied from a source of B+ through a separate resistance 210 connected in series with the associated resistance 204. A bias voltage, not shown, is coupled through delay line terminating impedance 212 to bias each of the anodes of diodes 202. Decade beam switching tube 205 is controlled by a push-pull type of signal which may be supplied from a bi-stable trigger circuit 214 which in turn is supplied through input terminal 216 from a source of pulses, not shown.

Basically, operation of the circuit shown in Fig. 4 produces a result similar to that of the circuit shown in Fig. 1. Pulses are fed through input terminal 216 to drive the trigger circuit 214, thereby producing a push-pull voltage on grid elements 218 and 220 which moves the electron beam in tube 205 from one anode to the next adjacent anode. When the beam is switched from anode A, conduction is initiated substantially instantaneously at the anode B.

Conduction through any of the anodes produces a voltage drop at the cathode of the associated diode 202 which overcomes the bias voltage on the diode anode and opens the diode to current flow, thus allowing the signal from the associated delay line tap to feed through coupling capacitor 206 to the output 208. If the pulse repetition frequency of the pulses fed through input terminal 216 is sufficient to cause the beam in tube 205 to sweep all of the anodes (X) times each second, then (X) cycles per second are either added to the carrier frequency or substituted from the carrier frequency, depending upon the beam sweep direction.

In some applications it may be desirable to avoid use of a decade beam to sweep the diode switches. The circuit of Fig. 5 shows such a circuit in block form, based upon digital computor techniques. This circuit is also disclosed and claimed in the above mentioned application Serial Number 590,722, filed June 11, 1956.

Referring to Fig. 5, it can be seen that input signals are fed through a terminal 230, from a source not shown, to a unit 232 which comprises a scale of 16 binary counter having a total of 8 outputs. The outputs from binary counter 232 are fed to a unit 234 which is a diode matrix type binary to bi-octal converter having a total of 16 outputs. The diode switching unit 236 controlled by unit 234, and the delay line unit 238 may be similar to the diode switching circuitry and delay line unit shown in Fig. 4.

Operation of the circuit of Fig. 5 is similar to operation of the circuit in Fig. 4 in that pulses impressed upon input terminal 230 control units 232 and 234 so as to feed diode switching voltages to unit 236 in a programmed sequence. The carrier signal impressed upon input 240 feeds through delay line 238 to any tap connected to an open or conducting diode switch and then on to the output terminal 242. As a result, the number of cycles either added to the carrier or subtracted from the carrier is controlled by the pulse repetition frequency of the pulses fed through input terminal 230. If this input pulse repetition frequency is sufficient to sweep all of the diode switches in unit 236 (X) cycles per second, output 242 sees a signal differing from the carrier signal frequency by the same (X) cycles per second. As was the case with the circuits shown in Fig. 1 and Fig. 4, the sweep direction of diode switches 236 governs whether or not the output signal is at a frequency higher than the carrier signal or at a frequency lower than the carrier signal.

The circuits heretofore shown contemplate a wide phase shift modulator suitable for shifting the phase of a carrier in a manner monotonically related to a characteristic of the modulating signal. In some applications it may be desirable to shift the carrier in exact increments for producing an output wave whose frequency can be selected in exact frequency increments with relation to the frequency of the carrier. The circuit of Fig. 6, shown in block form, can be used for this purpose.

Referring to Fig. 6, there is shown a wide range phase modulator, unit 246, which may be similar to any of the circuits shown in Figs. 1 and 2, Fig. 4 or Fig. 5. The carrier is supplied to an input terminal 248 and the output is taken from a terminal 250. The number of pulses fed to unit 246 through terminal 252 may be taken from any one or any combination of pulse sources 254, 256 and 258, through switches 260, 262 and 264. Pulses fed to input 268, in most applications, will be supplied from a source having a constant pulse repetition frequency as shown by curve A in Fig. 7. The output of unit 254 appearing at 266 and 269 may have a wave form as shown in Fig. 7B. The output from terminal 270 and the input at terminal 272 may appear as shown in Fig. 7C, while the output at terminal 273 may appear as shown in Fig. 7D. The output of terminals 266, 270 and 272 are differentiated by means of capacitors 274, 276 and 278 and associated resistors 280, 282 and 290. Diodes 292, 294 and 296 suppress positive pulses so that the wave form appearing at switch 260 is similar to that shown in Fig. 7E. The wave forms of Figs. 7F and G represent the wave forms at switch 262 and 264 respectively.

Switches 260, 262 and 264 make it possible to select any one or any combination or none of the pulse trains. For example, if only switch 264 is closed, one pulse per time period is fed to terminal 252 of the phase modulator 246. Closing of switch 262 alone will result in two pulses per time period. Closing of switch 262 and switch 264 at the same time will result in three pulses per time period. As can be seen, it is possible to combine the switches in such a manner that any number of pulses from 1 to 7 are transmitted in a given period of time.

Operation of the circuit can be understood if it be assumed that each pulse applied to terminal 252 advances the phase of the output signal by 45 electrical degrees. Thus, for every 8 pulses the output is phase advanced by exactly one complete cycle. It follows that the pulse rate necessary to give a certain desired frequency increment is 8 times greater than the desired frequency increment. In other words, if the desired frequency increment is 10 kilocycles per second with a total of 7 increments being available, as applied to a fixed carrier frequency of 2000 kilocycles per second, it can be seen that the frequency supplied to terminal 268 must be 80 kilocycles per second. With the input at this frequency and a carrier of 2000 kilocycles per second supplied at terminal 248, it is possible to select an output signal at terminal 250 which may be adjusted in 10 kilocycles per second increments from 2000 kilocycles per second to 2070 kilocycles per second. Furthermore, the selection may be accomplished almost instantaneously if switches 260, 262 and 264 are of the electronic type. An additional switch between terminal 268 and terminal 252 would make it possible to also select a frequency of 2080 kilocycles per second. Thus, 9 different carrier frequencies are obtainable in this embodiment with an accuracy dependent only upon that of two input frequencies, that is the 2000 kilocycles per second carrier and the input pulse train of 80 kilocycles per second.

The circuit of Fig. 8 shows another embodiment using a plurality of decade beam tubes. A carrier signal is supplied to terminal 300 of a wide range phase modulator 302, which may be similar to modulator 246 shown in Fig. 6. The output of the modulator 302 is taken from terminal 304 and modulator control pulses are applide at terminal 305 from three pulse combining switches 306, 308 and 310. Negative pulses are supplied to switches 306, 308 and 310 from differentiator and limiter circuits 313, 314 and 316, respectively.

Decade tube 318 supplies pulses to differentiator 312 and also to decade tube 320. In turn decade tube 320 supplies pulses to differentiator 314 and decade tube 322. Nine of the output channels from decade 322 supply signals to differentiator 316.

The circuit of Fig. 8 operates in cascade fashion such that for every 1000 input pulses applied at input terminals 312, decade tube 318 will have its output commutated through 100 revolutions; decade tube 320 through 10 revolutions; and decade tube 322 will have its output commutated through precisely one revolution.

The negative pulses in channels A through I, feeding switch 306 each carry a pulse train similar to the pulses shown Fig. 9, where the appropriate curves are similarly lettered A through I. Curve J represents the pulses fed from decade tube 318 to decade tube 320, which, if desired may also be differentiated. Pulses fed to switches 308 and 310 are similar to the pulses shown in Fig. 9, differing only in pulse rate.

Assuming that each of switches 306, 308 and 310 are nine position switches capable of selecting one or more of the input channels, it can be seen that any number of pulses from zero to 999, for every 1000 pulses on input terminals 312, may be obtained by setting the three decade switches in the desired manner. For example, if the carrier supplied to terminal 300 has a frequency of 2000 kilocycles per second and the control signal applied to terminals 312 has a frequency of 800 kilocycles per second, adjustment of switches 306, 308 and 310 make it possible to produce an output at terminal 304 varying from 2000 kilocycles per second to 2099.9 kilocycles per second in 1/10 kilocycle per second steps. If the output at terminal 304 is mixed in a non-linear device 309 with the unmodulated 2000 kilocycle per second carrier, by closing switch 324, thereby generating the difference frequency at terminal 311, the result will be a decade controlled frequency generator with a range from 100 cycles per second to 99,900 cycles per second in exact 100 cycles per second steps, controlled by a direct reading set of dials on switches 306, 308 and 310.

Thus, modulator 302 in Fig. 8 may be defined as means for cumulatively modifying the phase position of an output signal relative to the phase position of an input signal by a number of electrical degrees monotonically related to the frequency of occurence of a characteristic of a control signal, while the units supplying a control signal to terminals 305 may be defined as means for providing a control signal having said characteristic reoccuring at a selectable rate.

This circuit is extremely accurate in that any error in the 2000 kilocycle per second carrier frequency automatically is cancelled in the suggested mixing operation. Thus 999 frequency steps are available with exact relationship to the signal frequency of 800 kilocycles per second applied at terminals 312. The signal generator supplying this frequency to terminals 312 could be controlled by a temperature compensated crystal oscillator or some other extremely accurate source.

While there has been shown and described what is at present considered the preferred embodiments of the present invention, it will be obvious to those skilled in the art that various changes and modifications may be made therein without departing from the invention as defined by the appended claims.

What is claimed is:

1. A signal generator for producing an output signal having a frequency selectable in frequency increments comprising the combination of a source of signals having a substantially fixed fundamental frequency, phase shifting means coupled to said signal source for unidirectionally shifting the phase of said signal a given number of electrical degrees for each reoccurence of a given characteristic of a control signal, means for generating a plurality of control signals each having said given characteristic reoccuring at a different multiple of a given rate, selector means for selecting and mixing one or more of said control signals, and means for coupling the selected control signals to control said phase shifting means.

2. A signal generator for producing an output signal having a frequency selectable in frequency increments comprising the combination of a source of signals having a substantially fixed fundamental frequency, phase shifting means coupled to said signal source for unidirectionally shifting the phase of said signal a given number of electrical degrees for each given number of control pulses, means for generating a plurality of pulse trains each having a different multiple of a given pulse repetition frequency, selector means for selecting one or more of said pulse trains, and means for coupling the selected pulse trains to said phase shifting means to provide a control signal.

3. A signal generator for producing an output signal having a frequency selectable in frequency increments comprising the combination of a first source of signals having a substantially fixed fundamental frequency, phase shifting means coupled to said signal source for unidirectionally shifting the phase of said signal a given number of electrical degrees for each given number of control pulses, a chain of frequency dividers for producing a plurality of pulse trains, a second signal source coupled to feed said divider chain, selector means for selecting the output of one or more of said frequency dividers to control said phase shifting means.

4. A signal generator for producing an output signal having a frequency selectable in frequency increments comprising the combination of a source of signals having a substantially fixed fundamental frequency, phase shifting means coupled to said signal source for unidirectionally shifting the phase of said signal a given number of electrical degrees for each given number of control pulses, means for generating a plurality of pulse trains each having a different multiple of a given pulse repetition frequency, pulse rate selector means for selecting one or more of said pulse trains, means for coupling the selected pulse trains to said phase shifting means to provide a control signal, means for mixing the output of the phase shifting means and a signal from said source to produce an output frequency.

5. A signal generator for producing an output signal having a frequency selectable in frequency increments comprising the combination of a first source of signals having a substantially fixed fundamental frequency, phase shifting means coupled to said signal source for unidirectionally shifting the phase of said signal a given number of electrical degrees for each given number of control pulses, a chain of frequency dividers for producing a plurality of pulse trains, a second signal source coupled to feed said divider chain, selector means for selecting the output of one or more of said frequency dividers, means for coupling the output of said selector means to said phase shifting means to provide a control signal, means for mixing the output of the phase shifting means and a signal from said first source of signals to produce an output frequency.

6. A signal generator for producing an output signal having a frequency selectable in frequency increments comprising a plurality of carrier signal sources each providing a carrier signal of given fundamental frequency positioned in spaced time phase relative to the carrier signals from the other sources to provide a substantially symmetrical time phase array of carrier signals spread in phase increments through substantially 360 electrical degrees of the fundamental frequency, output terminals, pulse control means for coupling and decoupling the carrier signals to and from the output terminals in unidirectional sequence around the complete carrier signal phase array at a cyclic rate determined by the pulse repetition frequency of an input keying pulse train, a chain of frequency dividers for producing a plurality of keying pulse trains, a second signal source coupled to feed said divider chain and selector means coupled between said frequency divider chain and said control means for selecting the output of one or more of said frequency dividers to control said pulse control means.

References Cited in the file of this patent

UNITED STATES PATENTS

| | | |
|---|---|---|
| 2,262,468 | Percival | Nov. 11, 1941 |
| 2,666,181 | Courtillot | Jan. 12, 1954 |